United States Patent
Blosse et al.

(10) Patent No.: US 7,189,652 B1
(45) Date of Patent: Mar. 13, 2007

(54) SELECTIVE OXIDATION OF GATE STACK

(75) Inventors: Alain Blosse, Belmont, CA (US);
Sundar Narayanan, Santa Clara, CA (US); Krishnaswamy Ramkumar, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 338 days.

(21) Appl. No.: 10/313,048

(22) Filed: Dec. 6, 2002

(51) Int. Cl.
*H01L 21/302* (2006.01)

(52) U.S. Cl. .................... 438/696; 438/719; 438/720

(58) Field of Classification Search ............... 438/694, 438/696, 699, 719, 720
See application file for complete search history.

(56) References Cited

U.S. PATENT DOCUMENTS

| | | | |
|---|---|---|---|
| 5,385,866 A | 1/1995 | Bartush | |
| 5,393,685 A | 2/1995 | Yoo et al. | |
| 5,756,392 A | 5/1998 | Lu et al. | |
| 5,877,074 A | 3/1999 | Jeng et al. | |
| 6,127,227 A | 10/2000 | Lin et al. | |
| 6,165,884 A | 12/2000 | Lee et al. | |
| 6,177,334 B1 | 1/2001 | Chen et al. | |
| 6,287,913 B1 | 9/2001 | Agnello et al. | |
| 6,420,250 B1* | 7/2002 | Cho et al. | 438/595 |
| 6,429,496 B1 | 8/2002 | Li et al. | |
| 6,465,370 B1 | 10/2002 | Schrems et al. | |
| 6,465,837 B1 | 10/2002 | Wu | |
| 6,833,310 B2* | 12/2004 | Kim et al. | 438/424 |
| 2001/0010975 A1* | 8/2001 | Tanabe et al. | 438/770 |
| 2001/0031535 A1 | 10/2001 | Agnello et al. | |
| 2002/0042180 A1* | 4/2002 | Tuan et al. | 438/257 |
| 2002/0058410 A1 | 5/2002 | Sung et al. | |
| 2002/0197859 A1* | 12/2002 | Kim et al. | 438/655 |
| 2003/0170942 A1* | 9/2003 | Taguwa | 438/197 |

FOREIGN PATENT DOCUMENTS

EP    0 327 210    1/1989

OTHER PUBLICATIONS

Encyclopedia of Chemical Technology, Kirk-Othmer, vol. 14, pp. 677-709 (1995).

Diaz, C.H., H. Tao, Y. Ku, A. Yen, and K. Young, 2001. "An Experimentally Validated Analytical Model For Gate Line-Edge Roughness (LER) Effects on Technology Scaling", IEEE Electron Device Letters, 22(6)287-289.

Blosse, A.P., "Improved thermal stability of CVD $WSi_x$ during furnace oxidation by a rapid thermal anneal pretreatment"., published as "Rapid Thermal and Integrated Processing VII"., Semiconductors Electronic Material and Processing, vol. 525, 6 pages, (1998).

Kim, H-S., et al., "Sidewall oxidation behavior of dichlorosilane-based W-polycide gate"., J. Vac. Science Technology B, vol. 19, No. 2, pp. 361-365, (2001).

* cited by examiner

*Primary Examiner*—Duy-Vu N. Deo
*Assistant Examiner*—Binh X Tran
(74) *Attorney, Agent, or Firm*—Evan Law Group LLC

(57) ABSTRACT

A method of forming a semiconductor structure comprises oxidizing a stack, to form sidewall oxide in contact with sides of the stack. The stack is on a semiconductor substrate, the stack includes a gate layer, comprising silicon; a metallic layer, on the gate layer; and an etch-stop layer, on the metallic layer. The sidewall oxide in contact with the metallic layer is thinner than the sidewall oxide in contact with the gate layer.

15 Claims, 5 Drawing Sheets

180

SELECTIVE OXIDATION OF GATE STACK

BACKGROUND

Modern integrated circuits are constructed with up to several million active devices, such as transistors and capacitors, formed in and on a semiconductor substrate. Interconnections between the active devices are created by providing a plurality of conductive interconnection layers, such as polycrystalline silicon and metal, which are etched to form conductors for carrying signals. The conductive layers and interlayer dielectrics are deposited on the silicon substrate wafer in succession, with each layer being, for example, on the order of 1 micron in thickness.

A gate structure is an element of a transistor. FIG. 1 illustrates an example of a gate stack 8. A semiconductor substrate 10 supports a gate insulating layer 16, which overlaps doped regions (source/drain regions) in the substrate (12 and 14), and the gate insulating layer supports a gate 18, which is typically polycrystalline silicon. On the gate is a metallic layer 30. The metallic layer may be separated from the gate by one or more other layers, such as nitrides, oxides, or silicides, illustrated collectively as barrier layer 20. The metallic layer may in turn support one or more other layers (collectively 40), such as nitrides, oxides, or silicides. Sidewall oxide 22 may be formed on the sides of the gate to protect the gate oxide at the foot of the gate stack; and insulating spacers 24 may be formed on either side of the gate stack. Furthermore, contacts to the source/drain regions in the substrate, and to the gate structure, may be formed.

Self-aligned contacts (SAC) allow the design of a semiconductor device to have a distance between the gate and the via contact to the substrate, to be at most one-half the minimum gate width; the contact may even be designed to overlay the gate. Typically, SAC uses a nitride layer on the gate stack, together with spacers that include nitride, to prevent a misaligned contact from electrically contacting the gate itself. If the nitride were not present, then the etch used to form the hole which will become the contact would pass through the dielectric layer all the way to the gate. When present, the nitride layer and spacers act as an etch stop, preventing misalignment from forming a hole all the way to the gate, and therefore allowing design of the device to have a much smaller average distance between the contact and the gate.

The nitride layer on the gate stack has at least a thickness of 800 angstroms when used for forming SAC. If used only for other purposes, such as an etch-stop layer or a hard mask, a thickness of less than 800 angstroms is used. Also, the thickness of at least 800 angstroms is the thickness after the dielectric layer has been formed; the nitride layer is usually thicker when originally formed, allowing for a loss of about 500 angstroms during the gate etch (i.e. thickness for the hard mask function), and a loss of about 200 angstroms during nitride spacer formation.

Sidewall oxide on the sides of the gate to protect the gate oxide at the foot of the gate stack may be formed by oxidation. Since the sidewall oxide is formed after the layers of the gate structure is formed, it would be desirable to selectively oxidize the gate rather than other layers in the gate stack, such as the metallic layer.

BRIEF SUMMARY

In a first aspect, the present invention is a method of forming a semiconductor structure, comprising oxidizing a stack, to form sidewall oxide in contact with sides of the stack. The stack is on a semiconductor substrate, the stack comprises (i) a gate layer, comprising silicon; (ii) a metallic layer, on the gate layer; and (iii) an etch-stop layer, on the metallic layer. The sidewall oxide in contact with the metallic layer is thinner than the sidewall oxide in contact with the gate layer.

In a second aspect the present invention is a method of forming a semiconductor structure, comprising forming sidewall oxide on sides of a stack, by heating the stack in a gas comprising hydrogen and oxygen at a temperature of 650–750° C. The stack is on a semiconductor substrate, and the stack comprises (i) a gate layer, comprising silicon; (ii) a metallic layer, comprising tungsten, on the gate layer; and (iii) an etch-stop layer, comprising silicon and nitrogen, on the metallic layer.

In a third aspect, the present invention is a semiconductor structure, comprising a stack on a semiconductor substrate. The stack comprises (i) a gate layer, comprising silicon; (ii) a metallic layer, comprising tungsten, on the gate layer; (iii) an etch-stop layer, on the metallic layer; and (iv) sidewall oxide, in contact with sides of the stack. The sidewall oxide in contact with the metallic layer is thinner than the sidewall oxide in contact with the gate layer.

DETAILED DESCRIPTION

The present invention includes a method of oxidizing a gate layer to form sidewall oxide. The gate layer is preferentially oxidized over the metallic layer. Furthermore, the method allows for carrying out the oxidation process at lower temperatures, and provide relatively even formation of sidewall oxide on both $P^+$ and $N^+$ doped regions of the gate layer.

Figure 1:
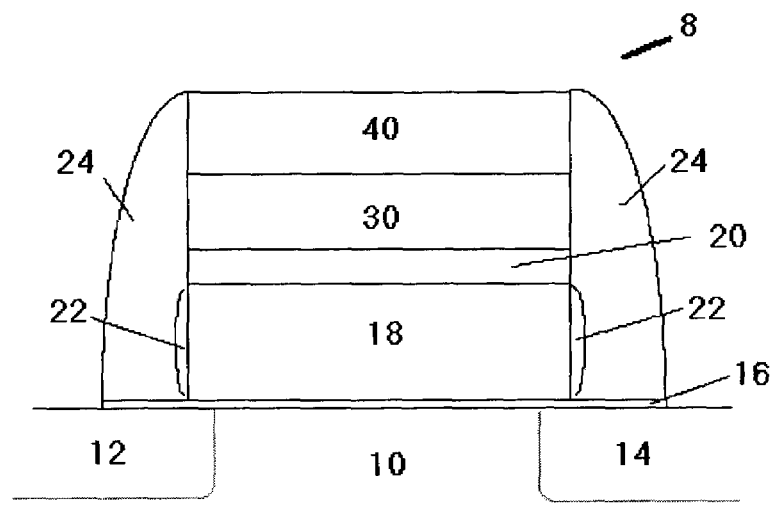
FIG. 1 shows a gate stack structure.
Figure 2:
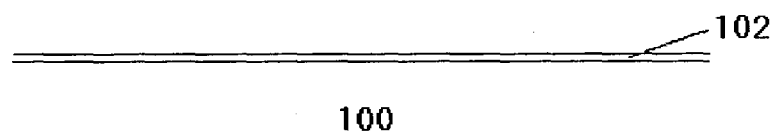
FIGS. 2–5 illustrate a method of forming the structure of FIG. 6.

Referring to FIG. 2, a gate insulating layer 102 is on a semiconductor substrate 100. The semiconductor substrate may be a conventionally known semiconductor material. Examples of semiconductor materials include silicon, gallium arsenide, germanium, gallium nitride, aluminum phosphide, and alloys such as $Si_{1-x}Ge_x$ and $Al_xGa_{1-x}As$, where $0 \leq x \leq 1$. Preferably, the semiconductor substrate is silicon, which may be doped or undoped. The gate insulating layer 102 may be a conventionally known insulating material. For example, the gate insulating layer may contain silicon oxide or silicon oxynitride.

Figure 3:
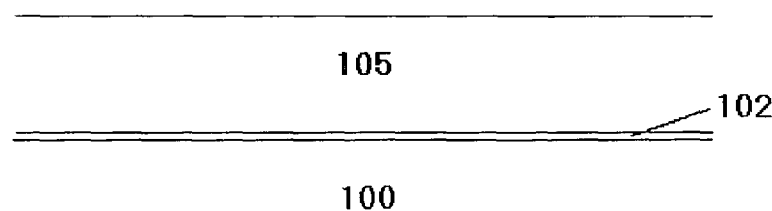

Referring to FIG. 3, a gate layer 105 may be formed on the gate insulating layer. The gate layer preferably has a thickness of 400–1200 angstroms, more preferably a thickness of 600–1000 angstroms, most preferably a thickness of 750–850 angstroms. The gate layer may contain a. variety of semiconducting materials. Typically, a gate layer contains polycrystalline silicon (poly) or amorphous silicon. The gate layer may be doped with one type of dopant ($P^+$ or $N^+$), or it may contain both types of dopants in discrete regions. A split gate is a gate layer containing both $P^+$ and $N^+$ doping regions.

In the case of a split gate, those regions of the gate that are P+ doped (such as with B or $BF_2^+$) are over N− doped channel regions of the substrate, forming a PMOS device; those regions of the gate that are N+ doped (such as with $As^+$ or phosphorus+) are over P− doped channel regions of the substrate, forming an NMOS device. The P+ and N+ doping regions of the gate are separated by a region which is on an isolation region of the substrate; this isolation region has a width of at most 0.4 microns, more preferably at most 0.36 microns. The doping of the regions of the gate is preferably carried out after forming the gate, by masking and doping each region separately, or by an overall doping of the gate with one dopant type, and then masking and doping only one region with the other dopant type (counter doping).

Figure 4:
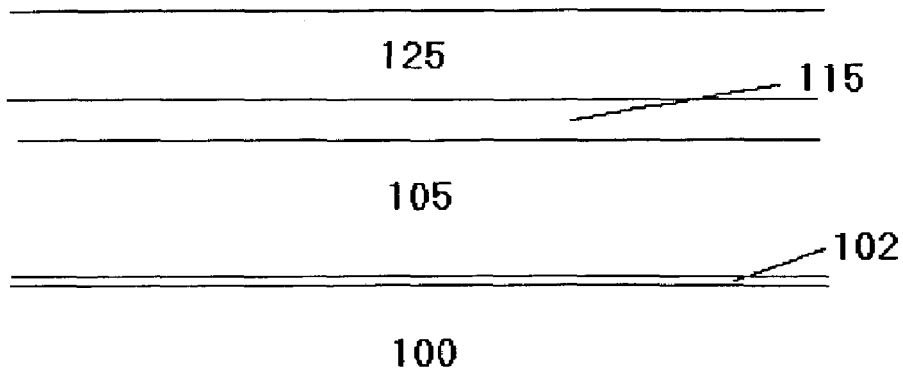

Referring to FIG. 4, a barrier layer 115 may optionally be formed on the gate layer. The barrier layer preferably has a thickness of 30–120 angstroms, more preferably 50–100 angstroms, most preferably 60–80 angstroms. The optional barrier layer may contain a variety of materials, including nitrides, silicides, and oxides, and is preferably a conductive material. For example, the barrier layer may contain refractory silicides and nitrides. Preferably, the barrier layer contains silicon nitride, or a nitride or silicide of a metal such as tantalum, titanium, niobium or tungsten, for example tungsten nitride.

Referring still to FIG. 4, a metallic layer 125 may be formed on the gate layer, or the barrier layer 115, if it is present. Preferably, the metallic layer has a thickness of 200–600 angstroms, more preferably 300–500 angstroms, most preferably 325–450 angstroms. The metallic layer 125 may contain a variety of metal-containing materials. For example, a metallic layer may contain aluminum, copper, tantalum, titanium, tungsten, or alloys or compounds thereof. Preferably, the metallic layer comprises tungsten or titanium. The metallic layer may be formed, for example, by physical vapor deposition (PVD) of the metal, or by low pressure chemical vapor deposition (LPCVD) of a mixture of a metal halide and hydrogen.

Figure 5:
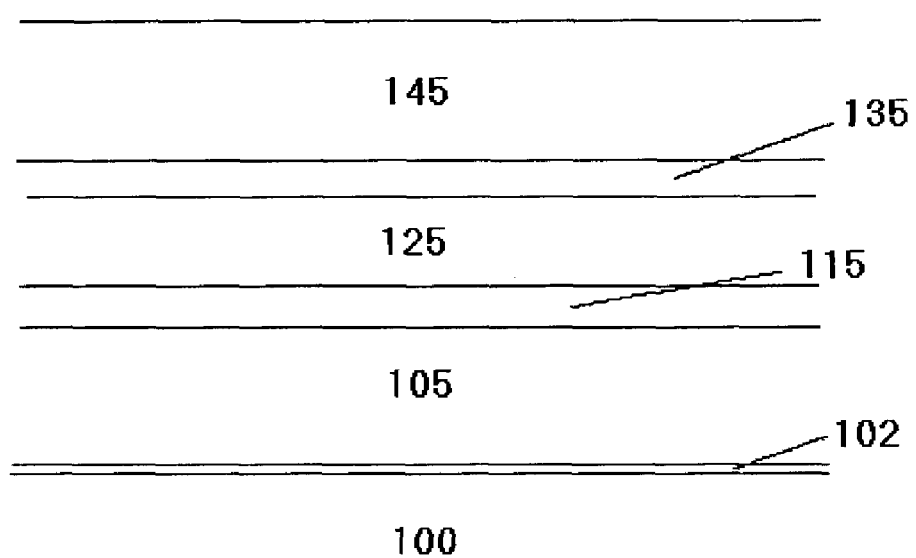

Referring to FIG. 5, a barrier layer 135 may optionally be formed on the metallic layer. The formation of the second optional barrier layer may be performed as described for the first optional barrier layer 115, and this layer may be formed of the same materials, and to the same thicknesses.

Referring still to FIG. 5, an etch-stop layer 145 may be formed on the metallic layer by a variety of methods, including chemical vapor deposition (CVD). Preferably, the etch-stop layer is a nitride layer. More preferably, the etch-stop layer is silicon nitride formed by PECVD. The etch-stop layer may vary in composition, so that the top of the etch-stop layer is anti-reflective, for example so that the top of the etch-stop layer is silicon rich silicon nitride, or silicon oxynitride; this layer may also act as a hard mask to protect the etch-stop layer during subsequent etches. Alternatively, a separate anti-reflective layer (ARC) may be formed.

Preferably, the etch-stop layer is formed rapidly at a relatively low temperature. For example, if the gate layer contains both P+ and N+ doping regions, diffusion of the dopants may occur if the wafer is maintained at sufficiently high temperatures for a prolonged period of time. Thus, it is desirable that any high temperature processing is performed only for relatively short periods of time. Likewise, it is desirable that any lengthy processing is carried out at relatively low temperatures. Preferably, the etch-stop layer is formed at a temperature of at most 750° C., if the atmosphere is substantially devoid of oxygen, or in a reducing environment (hydrogen rich). Under typical conditions, a temperature of at most 600° C. is preferred, at most 450° C. is more preferred. A temperature of at least 350° C. is preferred, such as 400° C. The depositing of the etch-stop layer is preferably carried out at a temperature and for a time that does not result in substantial diffusion between the P+ region and the N+ region in a split gate.

Preferably, the etch-stop layer has a thickness of at least 800 angstroms, more preferably a thickness of at least 1100 angstroms, most preferably a thickness of at least 1200, after etching of the gate layer, and after formation of gate spacers. About 500 angstroms of etch-stop may be lost during the gate layer etch, and about 200 angstroms of etch-stop may be lost during the spacer formation. Preferably, at least 1500 angstroms thickness of etch-stop are deposited, more preferably at least 1800 angstroms thickness of etch-stop are deposited, most preferably 2100 angstroms thickness of etch-stop are deposited. Preferably, after the gate layer etch and after spacer formation (or, alternatively, after the dielectric layer is formed), the etch-stop layer has a thickness of 800–1800 angstroms, more preferably a thickness of 1100–1500 angstroms, most preferably a thickness of 1200–1400 angstroms. Similarly, the thickness deposited would preferably be these same ranges, with an additional 700 angstroms added to accommodate loss during the gate layer etch and spacer formation, when material are used which may result in a loss of the etch-stop layer at these points in the process.

Figure 6:
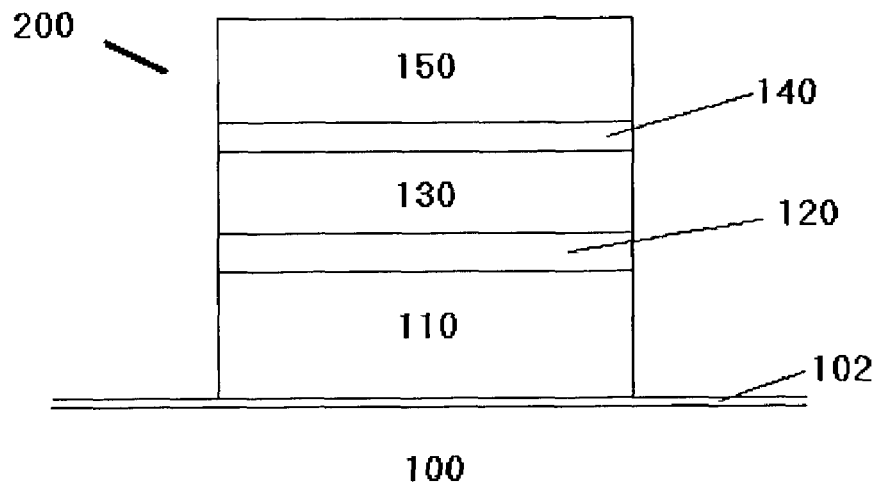
FIG. 6 shows a gate stack of the present invention.

Referring to FIG. 6, each layer may be patterned to form the gate stack. The patterning may be accomplished, for example, by conventional photolithographic and etching techniques. Referring to FIG. 6, the etch-stop layer may be etched to form a patterned etch-stop layer 150, for example by forming a patterned photoresist on etch-stop layer 145 (FIG. 5) and then etching the exposed portions of the layer. The etch-stop etching may be carried out by conventional etching techniques, for example by exposure to a plasma formed from a mixture of $CF_4$ and $CHF_3$. The patterned etch-stop layer may be used as a hard mask for the etching of the metallic layer 125 (FIG. 5) to form a patterned metallic layer 130. The patterned etch-stop layer and the patterned metallic layer may be used as a hard mask for the etching of the gate layer 105 (FIG. 5) to form patterned gate layer 110. The gate etching may be carried out by conventional gate etch techniques, for example by exposure to a plasma formed from chlorine, hydrobromic acid and/or oxygen.

FIG. 6 thus illustrates a gate stack 200 which may be formed on a semiconductor wafer. Semiconductor substrate 100 supports a gate insulating layer 102, which in turn supports a gate layer 110. The gate layer supports a metallic layer 130, which may optionally be separated from the gate layer by barrier layer 120. The metallic layer may optionally support a barrier layer 140. The etch-stop layer 150 is on the metallic layer 130, or optionally on the layer 140 above the metallic layer.

Figure 7:
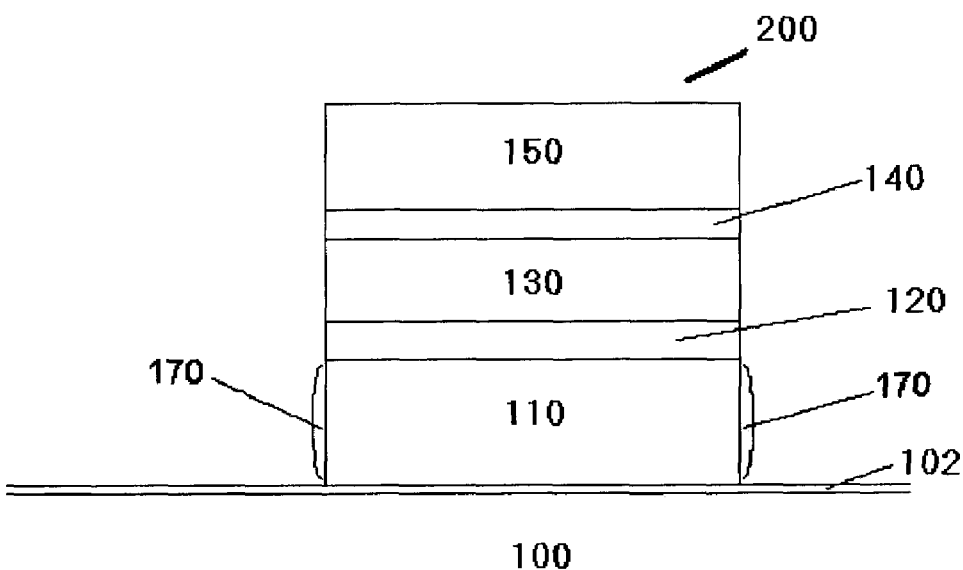
FIGS. 7–9 show further processing of the gate stack of FIG. 6.

A sidewall oxide 170 may then be formed on the gate stack 200, as illustrated in FIG. 7. Preferably, the sidewall is formed by oxidation in a gas comprising hydrogen and oxygen; some or all of the hydrogen and oxygen may be in the form of compounds, such as water ($H_2O$), rather than in elemental form. Preferably, the gas contains more hydrogen (by volume or atomic percent) than oxygen. More preferably, the gas comprises at most 20% steam (water) by volume, more preferably 5–15% steam by volume, including 8–12% steam by volume. Preferably the gas comprises at least 80% hydrogen (H$_2$) by volume, more preferably 85–95% hydrogen (H$_2$) by volume, including 88–92% hydrogen (H$_2$) by volume.

Preferably, the sidewall oxidation is carried out at a temperature of at most 850° C., more preferably at a temperature of less than 850° C., even more preferably at 650–850° C., including 675–750° C. Preferably, the oxidation is selective for the gate layer over the metallic layer, i.e. the thickness of oxide formed in contact with the metallic layer will be thinner than the thickness of oxide in contact with the gate layer. Preferably, the ratio of the thickness of the sidewall oxide on P$^+$:N$^+$ doped regions of the gate layer will be at most 2:1, more preferably 2:1–1:1. Preferably, the thickness of the sidewall oxide is at most 100 angstroms, more preferably at most 70 angstroms; this includes thicknesses of 20–70 angstroms, more preferably 25–50 angstroms. Preferably, there will be no substantial variation in the sheet resistance of the metallic layer, and preferably no substantial loss of metallic layer thickness.

"Substantial diffusion between the P$^+$ region and the N$^+$ region" of the gate means that the threshold voltage (V$_T$) one or both of the PMOS device or NMOS device changes by more than 20 mV, more preferably 10 mV, even more preferably 5 mV. In order to determine if a sidewall oxidation results in substantial diffusion between the P$^+$ region and the N$^+$ region of a particular split gate, a single PMOS device or NMOS device is formed, with the other part of the gate forming a comparatively very large reservoir of the opposite doping type, separated by an isolation region of the same size as the actual device. The PMOS device or NMOS device is formed using the selective oxidation to be tested, and using the nitride deposition used in the example, and BTBAS (bis-(t-butyl amino)silane) and ammonia at about 550° C. for spacer deposition, also as used in the example.

Figure 8:
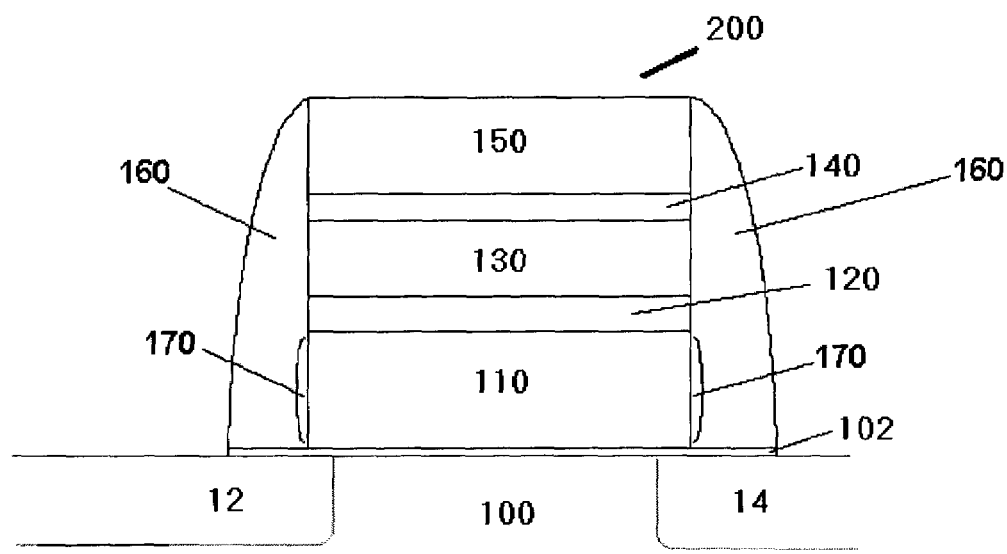
Figure 9:
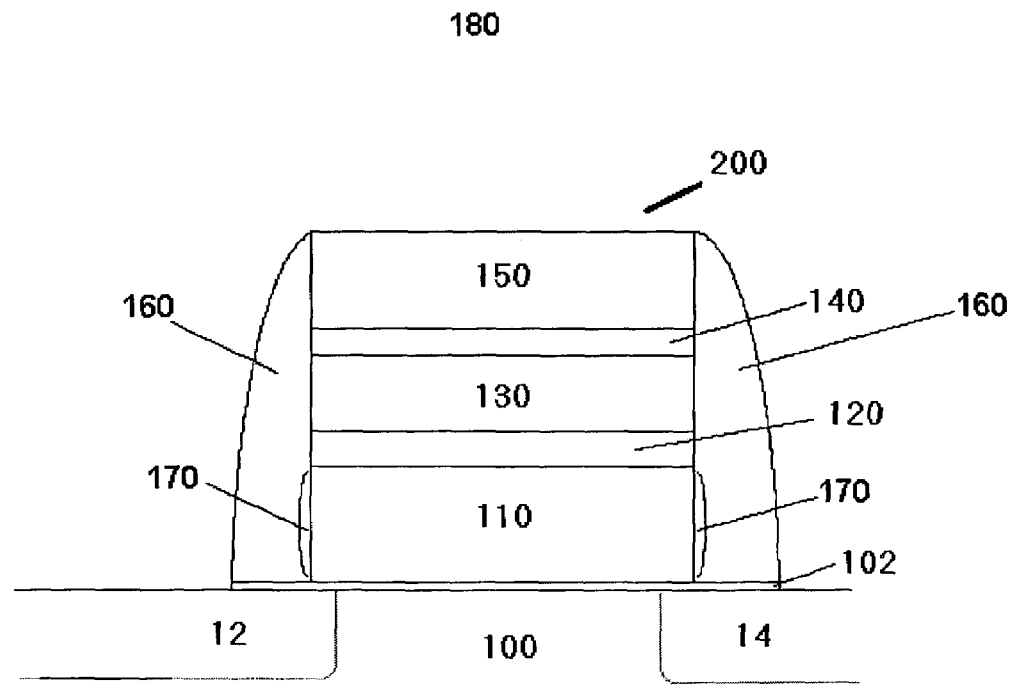
Figure 10:
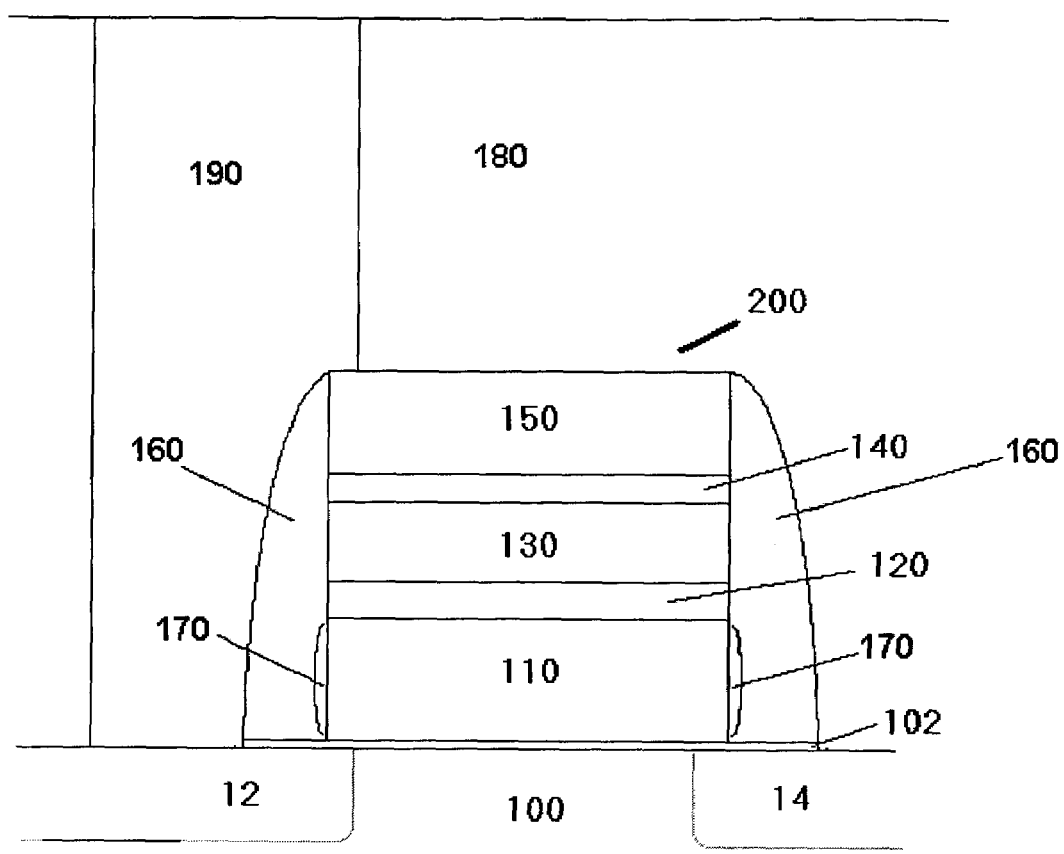
FIG. 10 shows the gate stack of FIG. 6 after further processing.

FIGS. 8–10 illustrate further processing of the gate structure. As shown in FIG. 8, spacers 160 (preferably containing nitride), may be formed on the sides of the stack. Furthermore, as shown in FIG. 9, a dielectric layer 180 maybe formed on the etch-stop layer.

Next, as shown in FIG. 10, a via 190 formed through the dielectric to the substrate, may be formed. This via may be lined and filled to form a via-contact, for example with TiN and tungsten, respectively. Other processing may include forming contacts to the gate itself.

Other processing may be used to complete formation of semiconductor devices from the semiconductor structure. For example, source/drain regions 12, 14 may be formed in the substrate, additional dielectric layers may be formed on the substrate, and contacts and metallization layers may be formed on these structures. These additional elements may be formed before, during, or after formation of the gate stack.

The related processing steps, including the etching of the gate stack layers and other steps such as polishing, cleaning, and deposition steps, for use in the present invention are well known to those of ordinary skill in the art, and are also described in Encyclopedia of Chemical Technology, Kirk-Othmer, Volume 14, pp. 677–709 (1995); Semiconductor Device Fundamentals, Robert F. Pierret, Addison-Wesley, 1996; Wolf, Silicon Processing for the VLSI Era, Lattice Press, 1986, 1990, 1995 (vols 1–3, respectively), and Microchip Fabrication 4rd. edition, Peter Van Zant, McGraw-Hill, 2000.

The semiconductor structures of the present invention may be incorporated into a semiconductor device such as an integrated circuit, for example a memory cell such as an SRAM, a DRAM, an EPROM, an EEPROM etc.; a programmable logic device; a data communications device; a clock generation device; etc. Furthermore, any of these semiconductor devices may be incorporated in an electronic device, for example a computer, an airplane or an automobile.

EXAMPLE

Example 1

Formation of a Gate Structure

The following detailed steps were used to form the gate stack having a split gate:
Nitrogen-containing gate oxide formation
Poly deposition—single amorphous gate deposit
Mask for P-doping
P$^+$ poly implantation
N-well implantation
P-channel implantation
P$^+$ poly implantation strip resist
Mask for N-doping
P-well implantation
N$^+$ poly implantation
N-channel implantation
N$^+$ poly implantation strip resist
Tungsten gate pre-clean
Tungsten PVD, sputtering (nitrogen+argon, then argon only)
Nitride—PECVD
Deposit ARC and Resist
Etch mask for nitride
Nitride etch—ARC, silicon nitride, and partial tungsten etch
Remove resist
Tungsten and Poly etch
Post-poly etch clean
Selective oxidation
N$^+$ source/drain extension implant
Stripping & cleaning
P$^+$ source/drain extension implant
Stripping & cleaning
Nitride spacer deposition (BTBAS chemistry)
Spacer etch
Post-spacer etch clean
N$^+$ source/drain implant
Stripping & cleaning
P$^+$ source/drain implant
Stripping & cleaning
Nitride-poly cut mask etch and clean
Dielectric deposition/planarization/mask for contacts
self-aligned contact (SAC) etch
SAC etch clean Bottom anti-reflective coating (BARC) was etched under the following conditions: CF$_4$ flow rate of 100 sccm, Ar flow rate of 100 sccm, power of 600 W, bias of 75 W, a pressure of 16 mTorr, and a temperature of 60° C. Temperature is controlled, for example, by He backside cooling during the BARC etch, as well as in subsequent steps.

The resist was then trimmed under the following conditions: HBr flow rate of 160 sccm, O$_2$ flow rate of 28 sccm, power of 400 W, a pressure of 8 mTorr, a temperature of 60° C., and for a time of 10 seconds. Alternatively, the resist was trimmed under the following conditions: HBr flow rate of 169 sccm, O$_2$ flow rate of 19 sccm, power of 400 W, a pressure of 8 mTorr, a temperature of 60° C., and for a time of 5 seconds.

Etching of the nitride was carried out with a plasma at a pressure of 30 mTorr, at a power of 500 W, a bias of 100 W, and at a temperature of 60–65° C. The gas composition is $CHF_3$ at 275 sccm and $CF_4$ at 300 sccm. An overetch of 20% was used.

The tungsten was partially etched under the following conditions: $NF_3$ flow rate of 10 sccm, $Cl_2$ flow rate of 25 sccm, $O_2$ flow rate of 5 sccm, Ar flow rate of 50 sccm, $N_2$ flow rate of 30 sccm, He flow rate of 150 sccm, power of 800 W, bias of 60 W, a pressure of 4 mTorr, a temperature of 60° C., and for a time of 10 seconds.

Resist material was removed by ashing (for example at 80° C. with a mixture of $CF_4$ and $O_2$), and the stack was cleaned by treating the wafer with EKC265™ (EKC, Hayward, Calif.; a mixture of 2-(2 aminoethoxy) ethanol, hydroxylamine and catechol) by spinning with spraying (using a spray tool) at 65 or 70° C. for 10 minutes, then 2 minutes at 20° C., followed by rinsing with deionized water, to prevent undesirable oxidation of the tungsten. This clean may be used for any stripping and cleaning step where tungsten or tungsten nitride is exposed to prevent undesirable oxidation. Also, the clean may be carried out with downstream plasma ashing under the following conditions, followed by washing with water: step 1: $CF_4$ flow rate of 50 sccm, $H_2O$ flow rate of 160 sccm, $N_2/H_2$ flow rate of 1400 sccm, power of 1050 W, bias of 100 W, a pressure of 750 mTorr, a temperature of 80° C., and for a time of 30 seconds; step 2: $NF_3$ flow rate of 40 sccm, $H_2O$ flow rate of 170 sccm, $O_2$ flow rate of 170 sccm, bias of 150 W, a pressure of 250 mTorr, a temperature of 80° C., and for a time of 120 seconds.

The tungsten was then etched under the following conditions: $NF_3$ flow rate of 15 sccm, $Cl_2$ flow rate of 25 sccm, $O_2$ flow rate of 5 sccm, Ar flow rate of 50 sccm, $N_2$ flow rate of 30 sccm, He flow rate of 150 sccm, power of 800 W, bias of 35 W, a pressure of 4 mTorr, and a temperature of 60° C. An overetch of the tungsten was carried out for 5 seconds. The system was then pumped down for 20 seconds.

The poly was then etched under the following conditions: HBr flow rate of 250 sccm, He(80%)/$O_2$(20%) flow rate of 12 sccm, power of 450 W, a bias of 40 W, a pressure of 25 mTorr, and a temperature of 60° C. A poly overetch was carried out under the following conditions: HBr flow rate of 150 sccm, He(80%)/$O_2$(20%) flow rate of 8 sccm, He flow rate of 100 sccm, power of 200W, a bias of 70W, a pressure of 70 mTorr, a temperature of 60° C., and for a time of 63 seconds. Alternatively, the poly overetch was carried out under the following conditions: HBr flow rate of 150 sccm, He(80%)/$O_2$(20%) flow rate of 13 sccm, He flow rate of 200 sccm, power of 250 W, a bias of 60 W, a pressure of 80 mTorr, a temperature of 60° C., and for a time of 53 seconds. Cleaning may be carried out as described above, or for example, by downstream, followed by rinsing with water (for example with deionized water for 7 cycles), under the following conditions: $CF_4$ flow rate of 40 sccm, $O_2$ flow rate of 1000 sccm, $H_2O$ flow rate of 200 sccm, $N_2$ flow rate of 150 sccm, power of 1700 W, a pressure of 700 mTorr, a temperature of 70° C., and for a time of 80 seconds.

The exposed sides of the poly were covered with a layer of oxide about 50–70 angstroms thick by the selective oxidation. This was carried out by exposing the stack to a mixture of hydrogen and oxygen (10% steam) at a temperature of 750° C. to selectively oxidize the poly relative to the tungsten and tungsten nitride.

BTBAS was used to form a nitride layer for spacer formation under the following conditions: BTBAS flow rate of 50 sccm, $NH_3$ flow rate of 100 sccm, a pressure of 150 mTorr, and a temperature of 550° C.

Etching of the nitride (nitride-poly cut mask etch and clean) was carried out with a plasma at a pressure of 35 mT, at a power of 280 W, and a temperature of 15° C. The gas composition for the main etch was $CHF_3$ at 30 sccm, Ar at 60 sccm, and $O_2$ at 10 sccm. The clean was carried out with plasma ashing in two steps, followed by a solvent clean:
Step 1:
pressure of 2 mTorr, temperature of 185° C., microwave power of 800 W, gas: $O_2$ at 3750 sccm, $N_2$ at 375 sccm;
Step 2:
same values, except a temperature of 200° C. and microwave power of 1400 W.

Etching to form contacts (SAC etch) was carried out with a plasma at a pressure of 55 mTorr, a power of 500 W, a temperature of 35° C., with the magnet at 20 Gauss, a gas of $CF_4$ at 5 sccm, $CHF_3$ at 10 sccm, $C_2H_2F_4$ at 10 sccm, and Ar at 90 sccm, as the ARC etch; and as the main etch a pressure of 55 mTorr, a power of 500 W, a tempature of 35° C., with the magnet at 25 Gauss, a gas of $CHF_3$ at 80 sccm, $C_2H_2F_4$ at 8 sccm, and Ar at 90 sccm. The clean was carried out with plasma ashing in two steps, followed by a solvent clean:
Step 1:
pressure of 400 mTorr, temperature of 20+/−5° C., RF power of 420 W, gas: $O_2$ at 400 sccm.
Step 2:
pressure of 750 mTorr, temperature of 20+/−5° C., RF power of 420 W, gas: $N_2$ at 400 sccm, $H_2$ at 400 sccm, and $NF_3$ at 5 sccm; or alternatively:
pressure of 750 mTorr, temperature of 40+/−5° C., RF power of 350 W, gas: $CF_4$ at 20 sccm, $N_2$/5% $H_2$ at 200 sccm, and $O_2$ at 500 sccm.

SAC etch clean was carried out using EKC 265™, with a spray tool: temperature of 70° C. for 10 minutes, and an extra 2 minutes at 20° C., followed by rinsing with deionized water and then spin drying in $N_2$; then washed with $H_2SO_4$ at 150° C. twice for 10 minutes each and then spin drying in $N_2$.

In the stack, the silicon nitride layer had a thickness of 1300 angstroms (although the actual amount deposited was greater since silicon nitride is lost during the poly etch and during spacer etch), the tungsten layer had a thickness of 325 angstroms, the tungsten nitride layer had a thickness of 75 angstroms, and the poly layer had a thickness of 735 angstroms. The contacts having a width of 0.13 microns at the top, and a width of 0.05 microns at the bottom.

Patent application Ser. No. 10/314,380, entitled "MULTI-LAYERED GATE STACK" by Saurabh Dutta Chowdhury, Cypress ref. PM02012, filed 6 Dec. 2002, is hereby incorporated by reference.

The invention claimed is:
1. A method of forming a semiconductor structure, comprising:
oxidizing a stack, to form sidewall oxide in contact with sides of the stack;
wherein the stack is on a semiconductor substrate, the stack comprises
(i) a gate layer, comprising silicon,
(ii) a metallic layer, on the gate layer, and
(iii) an etch-stop layer, on the metallic layer; and
the sidewall oxide in contact with the metallic layer is thinner than the sidewall oxide in contact with the gate layer, and
the sidewall oxide has a thickness of at most 100 angstroms, and
the oxidizing comprises heating the stack at a temperature of at most 850° C.

2. The method of claim 1, wherein the metallic layer comprises tungsten or titanium.

3. The method of claim 2, wherein the oxidizing comprises heating the stack in a gas comprising:
(a) hydrogen, and
(b) at most 20% steam.

4. The method of claim 2, wherein the gate layer comprises a $P^+$ region and an $N^+$ region, and
wherein the $P^+$ and $N^+$ regions are separated by a region which is on an isolation region of the substrate having a width of at most 0.4 microns.

5. The method of claim 4, wherein the oxidizing is carried out at a temperature and for a time that does not result in substantial diffusion between the $P^+$ region and the $N^+$ region.

6. The method of claim 4, wherein the ratio of the thickness of the sidewall oxide in contact with $P^+$:$N^+$ regions is 2:1 to 1:1.

7. A method of making a semiconductor device, comprising:
forming a semiconductor structure by the method of claim 2, and
forming a semiconductor device from the semiconductor structure.

8. A method of making an electronic device, comprising:
forming a semiconductor device by the method of claim 7, and
forming an electronic device comprising the semiconductor device.

9. A method of forming a semiconductor structure, comprising:
forming sidewall oxide on sides of a stack, by heating the stack in a gas comprising hydrogen and oxygen at a temperature of 650–750° C.;
wherein the stack is on a semiconductor substrate, and the stack comprises
(i) a gate layer, comprising silicon,
(ii) a metallic layer, comprising tungsten, on the gate layer, and
(iii) an etch-stop layer, comprising silicon and nitrogen, on the metallic layer.

10. The method of claim 9, wherein the gas comprises:
(a) hydrogen, and
(b) 5–15% steam.

11. The method of claim 9, wherein the sidewall oxide has a thickness of 20–50 angstroms.

12. The method of claim 9, wherein the gate layer comprises a $P^+$ region and an $N^+$ region, and
the ratio of the thickness of the sidewall oxide in contact with $P^+$:$N^+$ regions is 2:1 to 1:1.

13. The method of claim 12, wherein the oxidizing is carried out at a temperature and for a time that does not result in substantial diffusion between the $P^+$ region and the $N^+$ region.

14. A method of making a semiconductor device, comprising:
forming a semiconductor structure by the method of claim 9, and
forming a semiconductor device from the semiconductor structure.

15. A method of making an electronic device, comprising:
forming a semiconductor device by the method of claim 14, and
forming an electronic device comprising the semiconductor device.

* * * * *

UNITED STATES PATENT AND TRADEMARK OFFICE
CERTIFICATE OF CORRECTION

| | |
|---|---|
| PATENT NO. | : 7,189,652 B1 |
| APPLICATION NO. | : 10/313048 |
| DATED | : March 13, 2007 |
| INVENTOR(S) | : Alain Blosse, Sundar Narayanan and Krishnaswamy Ramkumar |

Page 1 of 1

It is certified that error appears in the above-identified patent and that said Letters Patent is hereby corrected as shown below:

In the claims:
Col. 8
In claim 1, line 12, please delete "and".

Signed and Sealed this

Twentieth Day of November, 2007

JON W. DUDAS
*Director of the United States Patent and Trademark Office*